(12) United States Patent
Wang et al.

(10) Patent No.: US 12,477,946 B2
(45) Date of Patent: Nov. 18, 2025

(54) COMPOSITION, OLED DEVICE AND OLED DISPLAY PANEL

(71) Applicant: KunShan Go-Visionox Opto-Electronics Co., Ltd, Kunshan (CN)

(72) Inventors: Hu Wang, Jiangsu (CN); Wei Zhao, Jiangsu (CN); Mengzhen Li, Jiangsu (CN); Jin Xu, Jiangsu (CN); Fangyi Cao, Jiangsu (CN); Bin Liu, Jiangsu (CN); Xiaokang Zhou, Jiangsu (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 995 days.

(21) Appl. No.: 17/566,231

(22) Filed: Dec. 30, 2021

(65) Prior Publication Data

US 2022/0123232 A1    Apr. 21, 2022

Related U.S. Application Data

(63) Continuation of application No. PCT/CN2020/104069, filed on Jul. 24, 2020.

(30) Foreign Application Priority Data

Nov. 29, 2019   (CN) .......................... 201911200961.6

(51) Int. Cl.
*H01L 51/50* (2006.01)
*H10K 85/30* (2023.01)
(Continued)

(52) U.S. Cl.
CPC ....... *H10K 85/6572* (2023.02); *H10K 85/324* (2023.02); *H10K 85/654* (2023.02); *H10K 85/6565* (2023.02); *H10K 50/16* (2023.02)

(58) Field of Classification Search
None
See application file for complete search history.

(56) References Cited

U.S. PATENT DOCUMENTS

2007/0032000 A1 * 2/2007 Yeh .................. G02F 1/133555
                                                              438/149
2017/0110669 A1    4/2017 Im

FOREIGN PATENT DOCUMENTS

CN         102498587 A  * 10/2012    ............. H01L 51/50
CN         103579514 A     2/2014
(Continued)

OTHER PUBLICATIONS

International Search Report mailed Oct. 13, 2020, in International Application No. PCT/CN2020/104069; 5 pages (with English Translation).

(Continued)

*Primary Examiner* — Gregory D Clark
(74) *Attorney, Agent, or Firm* — Maier & Maier, PLLC

(57) ABSTRACT

A composition, an OLED device and an OLED display panel. The composition includes a low-mobility metal complex material of bias-electron-transport-type in a mass percentage of 1% to 99% and an organic electron transport material in a mass percentage of 1% to 99%, wherein an electron mobility of the low-mobility metal complex material of bias-electron-transport-type is less than $1*E^{-7}$ cm$^2$/Vs. The influence of the electric field and the temperature on the electron mobility in the electron transport layer can be reduced, the balance of a carrier system in a high temperature environment is better, and the service life in the high temperature environment is long.

18 Claims, 1 Drawing Sheet

(51) Int. Cl.
  *H10K 85/60* (2023.01)
  *H10K 50/16* (2023.01)

(56) References Cited

FOREIGN PATENT DOCUMENTS

| | | |
|---|---|---|
| CN | 103700775 A | 4/2014 |
| CN | 104051631 A | 9/2014 |
| CN | 104659277 A | 5/2015 |
| CN | 105870348 A | 8/2015 |
| CN | 105244446 A | 1/2016 |
| CN | 109713142 A | 5/2019 |
| CN | 110911574 A | 3/2020 |

OTHER PUBLICATIONS

Chinese Office Action dated Feb. 26, 2021, in corresponding to Chinese Application No. 201911200961.6.
Chinese Office Action dated Oct. 27, 2021, in corresponding to Chinese Application No. 201911200961.6.

* cited by examiner

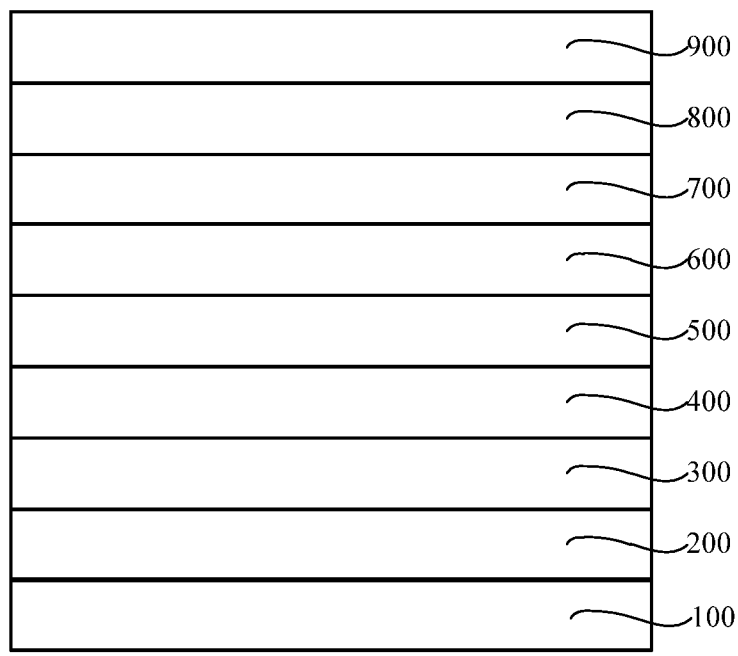

COMPOSITION, OLED DEVICE AND OLED DISPLAY PANEL

CROSS-REFERENCE TO RELATED APPLICATIONS

This application is a continuation of International Application No. PCT/CN2020/104069, filed on Jul. 24, 2020, which claims priority to Chinese Patent Application No. 201911200961.6, filed on Nov. 29, 2019. The disclosures of the aforementioned applications are hereby incorporated by reference in their entireties.

TECHNICAL FIELD

The present disclosure relates to the field of display technologies, in particular to a composition, an OLED device and an OLED display panel.

BACKGROUND

Organic electroluminescent (Organic Light Emitting Diode, OLED) devices have received extensive attention due to their advantages, such as self-luminescence, rich colors, fast response speed, wide view angle, light weight, thin thickness, less power consumption, and realization of flexible display, etc. Furthermore, OLED display apparatuses made by using OLED devices are regarded as display apparatuses having a great application prospect, and especially in the field of flat panel display, OLED display apparatuses are regarded as a trend. At present, the OLED display apparatuses have been widely used in the fields of mobile phones, watches, televisions, computers, on-board displays and other fields.

In some special application scenarios (such as on-board displays), an OLED display apparatus may be exposed to irradiation of sunlight for longer time than in other application scenarios. Under the irradiation of sunlight, the temperature of the OLED device will rise, resulting in an increase in mobility of electrons and holes in the OLED device, and an increasing ratio of the mobility of electrons is different from an increasing ratio of the mobility of holes, so that an original balance of carriers is destroyed, and redundant electrons or holes will accelerate the aging of the OLED device.

SUMMARY

In order to overcome the defects of the prior art, an object of the present disclosure is to provide a composition, an OLED device and an OLED display panel. The present disclosure can reduce a dependence of mobility of an electron transport layer on temperature and an electric field, and improve a balance of a carrier system in a high temperature environment, thereby facilitating increasing the service life of the OLED device in the high temperature environment and effectively reducing a problem that the driving voltage of the OLED device is increased due to charge accumulation caused by unbalance of carriers in the high temperature environment.

An embodiment of the present disclosure provides a composition for an electron transport layer of an OLED device, including a low-mobility metal complex material of bias-electron-transport-type in a mass percentage of 1% to 99% and an organic electron transport material in a mass percentage of 1% to 99%, wherein an electron mobility of the low-mobility metal complex material of bias-electron-transport-type is less than $1*E^{-7}$ cm$^2$/Vs.

The low-mobility metal complex material of bias-electron-transport-type includes a metal material and a complex material.

In this embodiment, the low-mobility metal complex material of bias-electron-transport-type is mixed into the organic electron transport material to form a composition, and the electron mobility of the low-mobility metal complex material of bias-electron-transport-type is less than $1*E^{-7}$ cm$^2$/Vs. Compared with a single organic electron transport material, the dependence of mobility of the composition on temperature and an electric field during electron transport is reduced, thereby facilitating improving a balance of a carrier system of an OLED device which includes the composition in a high temperature environment, and facilitating increasing a service life of the OLED device in the high temperature environment and solving a problem that the driving voltage is increased.

In the composition as described above, optionally, the metal material in the low-mobility metal complex material of bias-electron-transport-type includes any one of lithium, cesium, potassium, ytterbium, magnesium, calcium and sodium; and the complex material includes any one of a hydroxyquinoline group, a carbonic acid group, a trimethylacetic acid group, an oxalic acid group, a phenolic acid group and a fluoride group or a derivative thereof.

In the composition as described above, optionally, the low-mobility metal complex material of bias-electron-transport-type includes any one of cesium trimethylacetate, cesium carbonate, cesium oxalate, 8-hydroxyquinoline lithium and lithium fluoride.

In the composition as described above, optionally, the organic electron transport material includes any one of 4,7-diphenyl-1,10-phenanthroline (also known as Bphen), 2,2'-(1,3-phenyl)di[5-(4-tert-butyl phenyl)-1,3,4-oxadiazole] (also known as OXD-7), 8-hydroxyquinoline aluminum (also known as Alq3), 1,2,4-triazole derivative (also known as TAZ) and 1,3,5-tris(1-phenyl-1H-benzimidazol-2-yl)benzene (also known as TPBi).

In the composition as described above, optionally, a mass ratio of the low-mobility metal complex material of bias-electron-transport-type to the organic electron transport material is 3:7 to 7:3.

Setting the mass ratio of the low-mobility metal complex material of bias-electron-transport-type to the organic electron transport material within the range of 3:7 to 7:3 can ensure that the composition has an excellent performance. In the composition of this embodiment, the range of a preferred mass ratio of the low-mobility metal complex material of bias-electron-transport-type to the organic electron transport material is large, thereby facilitating reducing the manufacturing difficulty of the composition.

Another embodiment of the present disclosure provides an OLED device, including an anode layer, a cathode layer, a hole injection layer, a hole transport layer, an electron blocking layer, a light emitting layer, a hole blocking layer, an electron transport layer and an electron injection layer which are sequentially stacked along a direction from the anode layer to the cathode layer; wherein the electron transport layer includes a low-mobility metal complex material of bias-electron-transport-type in a mass percentage of 1% to 99% and an organic electron transport material in a mass percentage of 1% to 99%, wherein the electron mobility of the low-mobility metal complex material of bias-electron-transport-type is less than $1*E^{-7}$ cm$^2$/Vs. Preferably, the composition includes the low-mobility metal complex material of bias-electron-transport-type in a mass percentage of 20% to 70% and the organic electron transport material in a mass percentage of 30% to 80%, and an electron mobility of the low-mobility metal complex material of bias-electron-transport-type is less than $0.2*E^{-7}$ cm$^2$/Vs.

The low-mobility metal complex material of bias-electron-transport-type includes a metal material and a complex material.

A material of the electron transport layer of this embodiment includes a composition formed by mixing the low-mobility metal complex material of bias-electron-transport-type with the organic electron transport material, and the electron mobility of the low-mobility metal complex material of bias-electron-transport-type is less than $1*E^{-7}$ cm$^2$/Vs. Compared with an electron transport layer made by a single organic electron transport material, the dependence of mobility of the electron transport layer of this embodiment on temperature and an electric field during electron transport is reduced, thereby facilitating improving a balance of a carrier system of an OLED device in a high temperature environment, and facilitating increasing a service life of the OLED device in the high temperature environment and solving a problem that the driving voltage is increased.

In the OLED device as described above, optionally, the metal material in the low-mobility metal complex material of bias-electron-transport-type includes any one of lithium, cesium, potassium, ytterbium, magnesium, calcium and sodium; and the complex material includes any one of a hydroxyquinoline group, a carbonic acid group, a trimethylacetic acid group, an oxalic acid group, a phenolic acid group and a fluoride group or a derivative thereof.

In the OLED device as described above, optionally, the low-mobility metal complex material of bias-electron-transport-type includes any one of cesium trimethylacetate, cesium carbonate, cesium oxalate, 8-hydroxyquinoline lithium and lithium fluoride, or a combination of two thereof, or a combination of more thereof.

In the OLED device as described above, optionally, the organic electron transport material includes any one of 4,7-diphenyl-1,10-phenanthroline (also known as Bphen), 2,2'-(1,3-phenyl)di[5-(4-tert-butyl phenyl)-1,3,4-oxadiazole] (also known as OXD-7), 8-hydroxyquinoline aluminum (also known as Alq3), 1,2,4-triazole derivative (also known as TAZ) and 1,3,5-tris(1-phenyl-1H-benzimidazol-2-yl)benzene (also known as TPBi), or a combination of two thereof, or a combination of more thereof; and preferably includes 4,7-diphenyl-1,10-phenanthroline, 2,2'-(1,3-phenyl)di[5-(4-tert-butylphenyl)-1,3,4-oxadiazole] or 8-hydroxyquinoline aluminum.

In the OLED device as described above, optionally, the composition is formed by co-evaporation of the low-mobility metal complex material of bias-electron-transport-type and the organic electron transport material.

In the OLED device as described above, optionally, the anode layer is made of indium tin oxide, indium gallium zinc oxide or a combination thereof; the cathode layer is made of metal, indium tin oxide, indium gallium zinc oxide or a combination thereof; and the light emitting layer is selected according to a light emission color of the OLED device.

In the OLED device as described above, optionally, a mass ratio of the low-mobility metal complex material of bias-electron-transport-type to the organic electron transport material is 3:7 to 7:3.

Setting the mass ratio of the low-mobility metal complex material of bias-electron-transport-type to the organic electron transport material within the range of 3:7 to 7:3 can ensure that the electron transport layer of this embodiment has an excellent performance. In the electron transport layer of this embodiment, a range of a preferred mass ratio of the low-mobility metal complex material of bias-electron-transport-type to the organic electron transport material is large, thereby facilitating reducing the manufacturing difficulty of the electron transport layer.

Another embodiment of the present disclosure provides an OLED display panel, and the OLED display panel includes an OLED device as described in any one of the above embodiments.

As the OLED display panel of this embodiment includes the OLED device described above, the electron mobility in the electron transport layer is less affected by the electric field and the temperature, the balance of the carrier system is excellent in the high temperature environment, and the service life in the high temperature environment is long.

BRIEF DESCRIPTION OF DRAWINGS

In order to illustrate that embodiments of the present disclosure or the technical solution in the prior art more clearly, a brief description of the drawings required to be used in the description of the embodiments or the prior art will be made below. Obviously, the drawings in the following description are some embodiments of the present disclosure, and other drawings can be obtained according to the drawings by those ordinary skilled in the art without paying creative effort.

FIG. 1 is a schematic structural diagram of an OLED device provided by an embodiment of the present disclosure.

DESCRIPTION OF EMBODIMENTS

In order to make the objects, technical solutions and advantages of the embodiments of the present disclosure clearer, the technical solutions in the embodiments of the present disclosure will be clearly and comprehensively described below with reference to the drawings in the embodiments of the present disclosure. Apparently, the described embodiments are a part rather than all embodiments of the present disclosure.

All other embodiments obtained by those ordinary skilled in the art without paying creative effort, based on the embodiments in the present disclosure, are within the protection scope of the present disclosure. Embodiments described below and the features in the embodiments may be combined with each other without conflict.

Embodiment 1

This embodiment provides a composition for an electron transport layer of an OLED (Organic Light Emitting Diode) device, the composition includes a low-mobility metal complex material of bias-electron-transport-type in a mass percentage of 1% to 99% and an organic electron transport material in a mass percentage of 1% to 99%, wherein an electron mobility of the low-mobility metal complex material of bias-electron-transport-type is less than $1*E^{-7}$ cm$^2$/Vs.

Specifically, in this embodiment, the low-mobility metal complex material of bias-electron-transport-type is mixed into the organic electron transport material, and the electron mobility of the low-mobility metal complex material of bias-electron-transport-type is less than $1*E^{-7}$ cm$^2$/Vs. Compared with an electron transport layer made by a single organic electron transport material, the electron mobility of the composition of this embodiment is better. Also, compared with an electron transport layer made by a single organic electron transport material, after the low-mobility metal complex material of bias-electron-transport-type is mixed into the organic electron transport material, the composition of this embodiment weakens the influence of the electric field and the temperature on the electron mobility.

In this embodiment, the mass ratio of the low-mobility metal complex material of bias-electron-transport-type to the organic electron transport material can be set according to requirement, and the composition of this embodiment can be formed by co-evaporation of the low-mobility metal complex material of bias-electron-transport-type and the organic electron transport material.

In the embodiment, the composition is formed by mixing the low-mobility metal complex material of bias-electron-transport-type into the organic electron transport material, and the electron mobility of the low-mobility metal complex material of bias-electron-transport-type is less than $1*E^{-7}$ cm$^2$/Vs. Compared with an electron transport layer made by a single organic electron transport material, the dependence of the electron mobility of the composition of this embodiment on temperature and an electric field during electron transport is reduced, thereby facilitating improving the balance of the carrier system of an OLED device which includes the composition in the high temperature environment, and facilitating increasing the service life of the OLED device in the high temperature environment and solving the problem that the driving voltage is increased.

The low-mobility metal complex material of bias-electron-transport-type includes a metal material and a complex material.

In an optional embodiment, the metal material in the low-mobility metal complex material of bias-electron-transport-type of this embodiment includes any one of lithium (Li), cesium (Cs), potassium (K), ytterbium (Yb), magnesium (Mg), calcium (Ca) and sodium (Na); and the complex material includes any one of a hydroxyquinoline group, a carbonic acid group, a trimethylacetic acid group, an oxalic acid group, a phenolic acid group and a fluoride group or a derivative thereof.

Further, the low-mobility metal complex material of bias-electron-transport-type includes any one of cesium trimethylacetate, cesium carbonate, cesium oxalate, 8-hydroxyquinoline lithium and lithium fluoride.

Among them, cesium trimethylacetate is represented by the following formula (1):

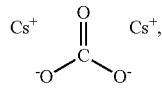

(1)

cesium carbonate is represented by the following formula (2):

Cs$_2$CO$_3$ (2), cesium oxalate is represented by the following formula (3):

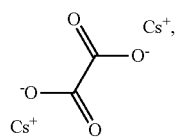

(3)

8-hydroxyquinoline lithium is represented by the following formula (4):

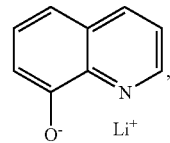

(4)

and lithium fluoride is represented by the following formula (5):

LiF (5).

In an optional embodiment, the organic electron transport material includes any one of 4,7-diphenyl-1,10-phenanthroline (also known as Bphen), 2,2'-(1,3-phenyl)di[5-(4-tert-butyl phenyl)-1,3,4-oxadiazole] (also known as OXD-7), 8-hydroxyquinoline aluminum (also known as Alq3), 1,2,4-triazole derivative (also known as TAZ) and 1,3,5-tris(1-phenyl-1H-benzimidazol-2-yl)benzene (also known as TPBi).

Among them, Bphen is represented by the following formula (6):

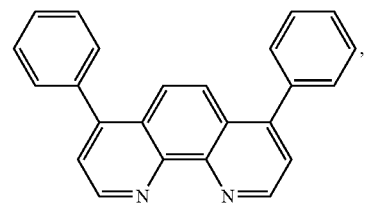

(6)

OXD-7 is represented by the following formula (7):

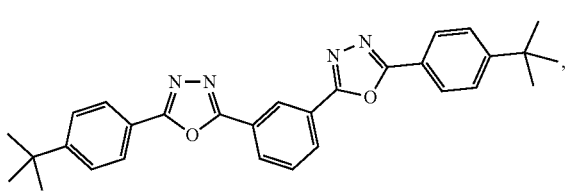

(7)

Alq3 is represented by the following formula (8):

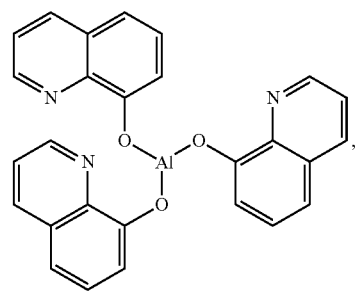

(8)

TAZ is represented by the following formula (9):

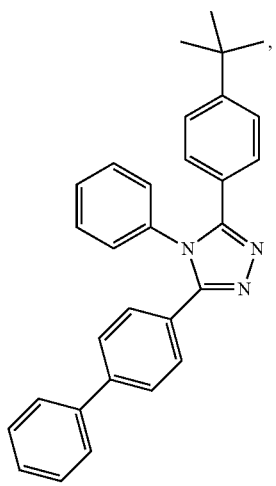

(9)

and
TPBi is represented by the following formula (10):

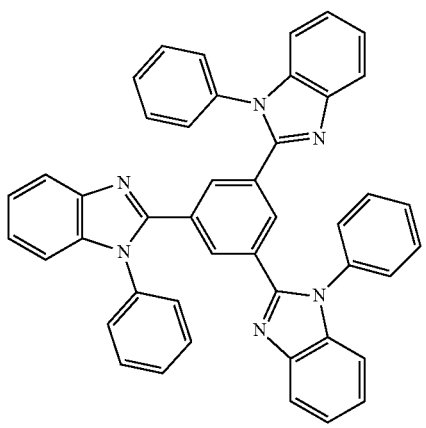

(10)

In an optional embodiment, the mass ratio of the low-mobility metal complex material of bias-electron-transport-type to the organic electron transport material is 3:7 to 7:3, preferably 5:6 to 4:2.

Setting the mass ratio of the low-mobility metal complex material of bias-electron-transport-type to the organic electron transport material within the range of 3:7 to 7:3 can ensure that the composition has an excellent performance. In the composition of this embodiment, the range of the preferred mass ratio of the low-mobility metal complex material of bias-electron-transport-type to the organic electron transport material is large, thereby facilitating reducing the manufacturing difficulty of the composition.

Embodiment 2

An OLED (Organic Light Emitting Diode) device has the problem of excessively fast aging in the high temperature environment, which is mainly caused by an imbalance of the carriers of the OLED device in the high temperature environment as discovered by the inventor. After further research, the inventor found that the reason for the imbalance of the carriers the OLED device in the high temperature environment is mainly due to the problems that the mobility of both electrons and holes of the OLED device is increased in the high temperature environment, and the increasing ratio of the mobility of the electrons is different from the increasing ratio of the mobility of the holes.

FIG. 1 is a schematic structural diagram of an OLED device provided by an embodiment of the present disclosure; please refer to FIG. 1. In view of the above problem, this embodiment provides an OLED device including an anode layer 100, a cathode layer 900, a hole injection layer 200, a hole transport layer 300, an electron blocking layer 400, a light emitting layer 500, a hole blocking layer 600, an electron transport layer 700 and an electron injection layer 800 which are sequentially stacked along a direction from the anode layer 100 to the cathode layer 900; wherein the electron transport layer 700 includes a low-mobility metal complex material of bias-electron-transport-type in a mass percentage of 1% to 99% and an organic electron transport material in a mass percentage of 1% to 99%, wherein an electron mobility of the low-mobility metal complex material of bias-electron-transport-type is less than $1*E^{-7}$ cm$^2$/Vs.

Among them, the anode layer 100 may be made of indium tin oxide (ITO), indium gallium zinc oxide (IGZO) or a combination thereof; the cathode layer 900 may be made of metal, indium tin oxide (ITO), indium gallium zinc oxide (IGZO) or a combination thereof; and the light emitting layer 500 is selected according to an light emission color of the OLED device. When voltages are applied to the anode layer 100 and the cathode layer 900 respectively, holes outputted from the anode layer 100 and electrons outputted from the cathode layer 900 are combined in the light emitting layer 500, and the light emitting layer 500 is excited to emit light.

The electron transport layer 700 of this embodiment includes a composition formed by mixing the low-mobility metal complex material of bias-electron-transport-type with the organic electron transport material, and the electron mobility of the low-mobility metal complex material of bias-electron-transport-type is less than $1*E^{-7}$ cm$^2$/Vs, and compared with an electron transport layer made of a single organic electron transport material, the electron mobility of the electron transport layer 700 of this embodiment is better. Also, after the low-mobility metal complex material of bias-electron-transport-type is mixed into the organic electron transport material, compared with an electron transport layer made of a single organic electron transport material, the electron transport layer 700 of this embodiment weakens the influence of the electric field and the temperature on the electron mobility.

In this embodiment, the mass ratio of the low-mobility metal complex material of bias-electron-transport-type to the organic electron transport material can be set according to requirement, and the composition of this embodiment can be formed by co-evaporation of the low-mobility metal complex material of bias-electron-transport-type and the organic electron transport material.

The low-mobility metal complex material of bias-electron-transport-type includes a metal material and a complex material.

The material of the electron transport layer 700 of this embodiment includes a composition formed by mixing the low-mobility metal complex material of bias-electron-transport-type with the organic electron transport material. Compared with an electron transport layer made by the single organic electron transport material, the dependence of mobility of the electron transport layer 700 of this embodiment on the temperature and the electric field during electron transport is reduced, thereby facilitating improving the balance of the carrier system of an OLED device in the high temperature environment, and facilitating increasing the service life of the OLED device in the high temperature environment and solving the problem that the driving voltage is increased.

In an optional embodiment, the metal material in the low-mobility metal complex material of bias-electron-transport-type of this embodiment includes any one of lithium (Li), cesium (Cs), potassium (K), ytterbium (Yb), magnesium (Mg), calcium (Ca) and sodium (Na); and the complex material includes any one of a hydroxyquinoline group, a carbonic acid group, a trimethylacetic acid group, an oxalic acid group, a phenolic acid group and a fluoride group or a derivative thereof.

Further, the low-mobility metal complex material of bias-electron-transport-type includes any one of cesium trimethylacetate, cesium carbonate, cesium oxalate, 8-hydroxyquinoline lithium and lithium fluoride.

Among them, cesium trimethylacetate is represented by the following formula (1):

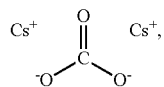

(1)

cesium carbonate is represented by the following formula (2):

$Cs_2CO_3$ (2), cesium oxalate is represented by the following formula (3):

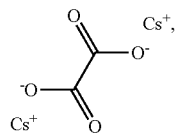

(3)

8-hydroxyquinoline lithium is represented by the following formula (4):

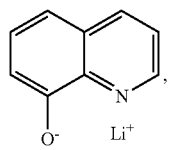

(4)

and lithium fluoride is represented by the following formula (5):

LiF (5).

In an optional embodiment, the organic electron transport material includes any one of 4,7-diphenyl-1,10-phenanthroline (also known as Bphen), 2,2'-(1,3-phenyl)di[5-(4-tert-butyl phenyl)-1,3,4-oxadiazole] (also known as OXD-7), 8-hydroxyquinoline aluminum (also known as Alq3), 1,2,4-triazole derivative (also known as TAZ) and 1,3,5-tris(1-phenyl-1H-benzimidazol-2-yl)benzene (also known as TPBi).

Among them, Bphen is represented by the following formula (6):

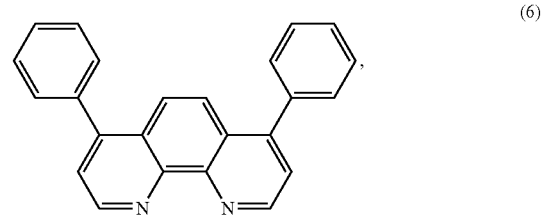 [SMILES: c1ccc(-c2ccnc3c2ccc2c(-c4ccccc4)ccnc23)cc1]

(6)

OXD-7 is represented by the following formula (7):

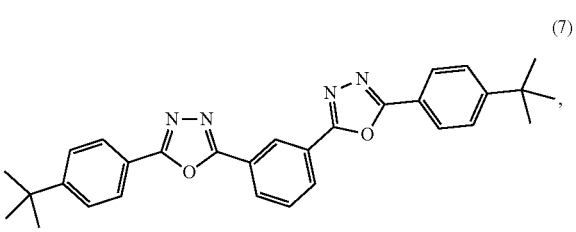 [SMILES: CC(C)(C)c1ccc(-c2nnc(-c3cccc(-c4nnc(-c5ccc(C(C)(C)C)cc5)o4)c3)o2)cc1]

(7)

Alq3 is represented by the following formula (8):

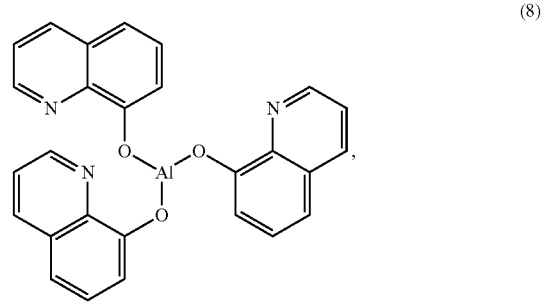

(8)

TAZ is represented by the following formula (9):

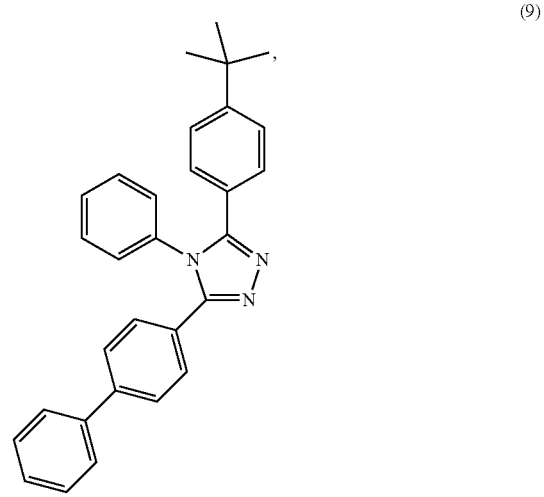 [SMILES: CC(C)(C)c1ccc(-c2nnc(-c3ccc(-c4ccccc4)cc3)n2-c2ccccc2)cc1]

(9)

and
TPBi is represented by the following formula (10):

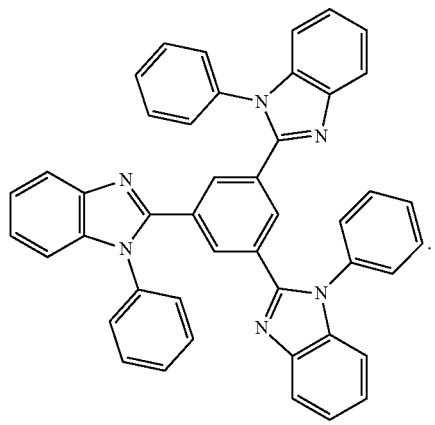

(10)

In an optional embodiment, the mass ratio of the low-mobility metal complex material of bias-electron-transport-type to the organic electron transport material is 3:7 to 7:3.

Setting the mass ratio of the low-mobility metal complex material of bias-electron-transport-type to the organic electron transport material within the range of 3:7 to 7:3 can ensure that the electron transport layer of this embodiment has an excellent performance. In the electron transport layer of this embodiment, the range of the preferred mass ratio of the low-mobility metal complex material of bias-electron-transport-type to the organic electron transport material is large, thereby facilitating reducing the manufacturing difficulty of the electron transport layer.

Embodiment 3

This embodiment provides an OLED (Organic Light Emitting Diode) display panel, and the OLED display panel includes the OLED device as described in Embodiment 2 above.

As the OLED display panel of this embodiment adopts the OLED device described above, the electron mobility in the electron transport layer is less affected by the electric field and the temperature, the balance of the carrier system is good in the high temperature environment, and the service life in the high temperature environment is long.

Embodiment 4

This embodiment provides a display apparatus, and the display apparatus includes the OLED (Organic Light Emitting Diode) display panel as described in Embodiment 3 above.

As the display apparatus of this embodiment adopts the OLED display panel described above, the electron mobility in the electron transport layer is less affected by the electric field and the temperature, the balance of the carrier system is good in the high temperature environment, and the service life in the high temperature environment is long.

Finally, it should be noted that the above embodiments are only for illustrating the technical solutions of the present disclosure, and are not intended to limit it. Although the present disclosure has been described in detail with reference to the foregoing embodiments, it will be understood by those ordinary skilled in the art that they can still modify the technical solutions described in the foregoing embodiments, or equivalently substitute some or all of the technical features therein; and these modifications or substitutions do not make the essence of the corresponding technical solutions deviate from the scope of the technical solutions of the embodiments of the present disclosure.

What is claimed is:

1. A composition for an electron transport layer of an organic electroluminescent OLED device, the composition comprising: a low-mobility metal complex material of bias-electron-transport-type in a mass percentage of 1% to 99% and an organic electron transport material in a mass percentage of 1% to 99%, wherein an electron mobility of the low-mobility metal complex material of bias-electron-transport-type is less than $1*E^{-7}$ cm$^2$/Vs; wherein the low-mobility metal complex material of bias-electron-transport-type comprises a complex material, and wherein the complex material comprises any one of a carbonic acid group, a trimethylacetic acid group, an oxalic acid group, a phenolic acid group and a fluoride group or a derivative thereof.

2. The composition according to claim 1, wherein the composition comprises the low-mobility metal complex material of bias-electron-transport-type in a mass percentage of 20% to 85% and the organic electron transport material in a mass percentage of 40% to 90%, and the electron mobility of the low-mobility metal complex material of bias-electron-transport-type is less than $0.2*E^{-7}$ cm$^2$/Vs.

3. The composition according to claim 1, wherein the low-mobility metal complex material of bias-electron-transport-type comprises a metal material and a complex material; and the metal material comprises any one of lithium, cesium, potassium, ytterbium, magnesium, calcium and sodium.

4. The composition according to claim 3, wherein the metal material comprises lithium, cesium or potassium; and the complex material comprises the carbonic acid group or the trimethylacetic acid group.

5. The composition according to claim 3, wherein the low-mobility metal complex material of bias-electron-transport-type comprises any one of cesium trimethylacetate, cesium carbonate, cesium oxalate, and lithium fluoride, or a combination of two thereof, or a combination of more thereof.

6. The composition according to claim 5, wherein the low-mobility metal complex material of bias-electron-transport-type comprises cesium trimethylacetate.

7. The composition according to claim 1, wherein the organic electron transport material comprises any one of 4,7-diphenyl-1,10-phenanthroline, 2,2'-(1,3-phenyl)di[5-(4-tert-butyl phenyl)-1,3,4-oxadiazole], 1,2,4-triazole derivative and 1,3,5-tris(1-phenyl-1H-benzimidazol-2-yl)benzene.

8. The composition according to claim 7, wherein the organic electron transport material comprises 4,7-diphenyl-1,10-phenanthroline, 2,2'-(1,3-phenyl)di[5-(4-tert-butylphenyl)-1,3,4-oxadiazole].

9. The composition according to claim 1, wherein a mass ratio of the low-mobility metal complex material of bias-electron-transport-type to the organic electron transport material is 3:7 to 7:3.

10. The composition according to claim 9, wherein the mass ratio is 5:6 to 4:2.

11. The composition according to claim 1, wherein the composition is formed by co-evaporation of the low-mobility metal complex material of bias-electron-transport-type and the organic electron transport material.

12. An OLED device, comprising: an anode layer, a cathode layer, a hole injection layer, a hole transport layer, an electron blocking layer, a light emitting layer, a hole blocking layer, an electron transport layer and an electron injection layer which are sequentially stacked along a direction from the anode layer to the cathode layer; wherein the electron transport layer comprises a low-mobility metal complex material of bias-electron-transport-type in a mass percentage of 1% to 99% and an organic electron transport material in a mass percentage of 1% to 99%, wherein an electron mobility of the low-mobility metal complex material of bias-electron-transport-type is less than $1*E^{-7}$ cm$^2$/Vs; wherein the low-mobility metal complex material of bias-electron-transport-type comprises any one of a carbonic acid group, a trimethylacetic acid group, an oxalic acid group, a phenolic acid group and a fluoride group or a derivative thereof.

13. The OLED device according to claim 12, wherein the low-mobility metal complex material of bias-electron-transport-type comprises a metal material and a complex material; and the metal material comprises any one of lithium, cesium, potassium, ytterbium, magnesium, calcium and sodium.

14. The OLED device according to claim 13, wherein the low-mobility metal complex material of bias-electron-transport-type comprises any one of cesium trimethylacetate, cesium carbonate, cesium oxalate, and lithium fluoride.

15. The OLED device according to claim 12, wherein the organic electron transport material comprises any one of 4,7-diphenyl-1,10-phenanthroline, 2,2'-(1,3-phenyl)di[5-(4-tert-butylphenyl)-1,3,4-oxadiazole], 1,2,4-triazole derivative and 1,3,5-tris(1-phenyl-1H-benzimidazol-2-yl)benzene.

16. The OLED device according to claim 12, wherein a mass ratio of the low-mobility metal complex material of bias-electron-transport-type to the organic electron transport material is 3:7 to 7:3.

17. The OLED device according to claim 12, wherein the anode layer is made of indium tin oxide, indium gallium zinc oxide or a combination thereof; the cathode layer is made of metal, indium tin oxide, indium gallium zinc oxide or a combination thereof; and the light emitting layer is selected according to a light emission color of the OLED device.

18. An OLED display panel, comprising the OLED device according to claim 12.

* * * * *